(12) United States Patent
Watanabe

(10) Patent No.: US 6,245,650 B1
(45) Date of Patent: Jun. 12, 2001

(54) PROCESS FOR PRODUCTION OF SEMICONDUCTOR DEVICE

(75) Inventor: Kaori Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/493,239

(22) Filed: Jan. 28, 2000

(30) Foreign Application Priority Data

Jan. 28, 1999 (JP) .................................................. 11-020447

(51) Int. Cl.⁷ .................................................. H01L 21/28
(52) U.S. Cl. .................................................. 438/580; 438/3
(58) Field of Search .............................. 438/3, 645, 672, 438/692, 693, 697, 754, 691, 580

(56) References Cited

U.S. PATENT DOCUMENTS

| | | | |
|---|---|---|---|
| 5,700,383 | * 12/1997 | Feller et al. .............................. | 216/88 |
| 5,705,089 | * 1/1998 | Sugihara et al. ......................... | 252/79 |
| 5,885,362 | * 3/1999 | Morinaga et al. ......................... | 134/2 |
| 5,993,686 | * 11/1999 | Streinz et al. ........................... | 252/79 |

FOREIGN PATENT DOCUMENTS

| | | |
|---|---|---|
| 3-228327 | 10/1991 | (JP) . |
| 4-130100 | 5/1992 | (JP) . |
| 5-6884 | 1/1993 | (JP) . |
| 6-41773 | 2/1994 | (JP) . |
| 6-333898 | 12/1994 | (JP) . |
| 7-45580 | 2/1995 | (JP) . |
| 7-130702 | 5/1995 | (JP) . |
| 7-193035 | 7/1995 | (JP) . |
| 8-31781 | 2/1996 | (JP) . |
| 10-12836 | 1/1998 | (JP) . |
| 2841627 | 10/1998 | (JP) . |

* cited by examiner

Primary Examiner—David Nelms
Assistant Examiner—David Nhu
(74) Attorney, Agent, or Firm—McGinn & Gibb, PLLC

(57) ABSTRACT

A process for producing, starting from a silicon substrate, a semiconductor device having a capacitor part comprising platinum group metal electrodes and a ferroelectric film, which process comprises a cleaning step of cleaning and removing the platinum group metal-derived contaminants adhering onto (1) the silicon-based insulating film formed in contact with the platinum group metal of the electrode(s) and (2) the back surface of the silicon substrate, by using a cleaning solution comprising a chemical solution for metal removal and very small amounts of hydrofluoric acid and a chelating agent. This process can remove platinum group metal-derived contaminants reliably and can prevent the re-adhesion of the once-removed contaminants.

22 Claims, 8 Drawing Sheets

↓ Washing, etching and mask removing

Washing and contact opening

_US 6,245,650 B1_

PROCESS FOR PRODUCTION OF SEMICONDUCTOR DEVICE

BACKGROUND OF THE INVENTION

1. Field of the Invention

The present invention relates to a process for production of a semiconductor device, particularly to a process for production of a semiconductor device having a capacitor part comprising electrodes made of a platinum group metal (e.g. platinum or iridium), which process comprises steps of removing the contaminants derived from the platinum group metal.

2. Description of the Related Art

Memory cells such as DRAM have become increasingly fine in recent years, but it is difficult to allow them to have a sufficient capacity when a conventional nitride or oxide film is used as the dielectric film, because the film has a dielectric constant of only about 2 to 3. In order to solve this problem, there has come to be used a ferroelectric film having an ionic bond type perovskite structure composed of barium titanate, strontium titanate, barium strontium titanate or the like. Also, logic LSI's mounting a ferroelectric random access memory (FeRAM) thereon have come to be widely used in IC cards or general-purpose microcomputers, and ferroelectric films such as PZT ($Pb(ZrTi)O_3$) and SBT ($SrBi_2Ta_2O_9$) are in use as the capacitive insulating film of the FeRAM. These ferroelectric films, when in direct contact with the substrate of FeRAM, give rise to oxidation of the substrate and consequent deterioration of FeRAM capacity. Therefore, in using such a ferroelectric film composed of the above material, there has come to be used an upper or lower capacitor electrode composed of a platinum group metal (e.g. platinum or iridium) which is non-reactive to the material of ferroelectric film. FIG. 4(a) to FIG. 4(i) are sectional views showing the steps employed in production of a semiconductor memory device which has, in combination, a MOS transistor and a capacitor part comprising platinum group metal electrodes and a ferroelectric film and which can conduct data storage by charge accumulation. Referring to these figures, an example of use of platinum group metal in production of a semiconductor memory device is described specifically.

First, a MOS type transistor is formed on a silicon substrate 1 according to a known method, as shown in FIG. 4(a). That is, there is formed a field oxide 2 as an element-isolating region, by a known method such as LOCOS (Local Oxidation of Silicon); subsequently, there is formed a silicon oxide film as a gate-insulating film 3 in a thickness of about 50 to 100 nm, by thermal oxidation. Then, a P-doped polysilicon film and a WSi film are formed in this order; after which they are subjected to patterning to form a gate electrode 4. Thereafter, ion implantation is conducted to form an impurity-diffused layer 5, whereby a MOSFET is completed.

Next, as shown in FIG. 4(b), there is formed, by CVD, a boron-containing silicon oxide film (BPSG) as a first inter-layer insulating film 6; then, etching is conducted to form a contact hole; in the hole are formed a Ti film and a W film in this order to form a vertical interconnect 7.

Subsequently, as shown in FIG. 4(c), there is formed a platinum thin film which becomes a lower electrode layer 8 of capacitor part; then, there are formed a ferroelectric film 9 (e.g. PZT) and a platinum thin film which becomes an upper electrode layer 10 of capacitor part, in this order.

Next, as shown in FIG. 4(d), a masking layer 11 consisting of a silicon oxide film is formed in order to protect the above-formed capacitor part at a time when other element part is formed.

After the other element part has been formed, a photoresist pattern 12 is formed on the masking layer 11, as shown in FIG. 4(e). Using this resist pattern as a mask, the masking layer 11, the upper electrode layer 10, the ferroelectric film 9 and the lower electrode layer 8 are dry-etched to form a desired capacitor part 14 and leave thereon the masking layer 11, as shown in FIG. 4(f).

Next, the masking layer 11 is removed, as shown in FIG. 4(g). Then, a second inter-layer insulating film 15 is formed so as to cover the capacitor part 14 and the first inter-layer insulating film 6, as shown in FIG. 4(h); thereafter, there is formed, in the film 15, an opening 16 for connecting an upper wiring (to be formed later) to the upper electrode layer 10, as shown in FIG. 4(i).

Lastly, a metal film is formed so as to fill the opening 16 and further cover the whole surface of the material obtained in the step of FIG. 4(i); the metal film is subjected to patterning to form a desired upper wiring 17; thereon is formed a third inter-layer insulating film 18 (e.g. a silicon nitride film), whereby is formed a semiconductor memory device such as shown in the sectional view of FIG. 3.

In the steps of FIG. 4, in conducting etching to form a capacitor part 14 having a masking layer thereon, there was a fear that the etching residue adhered to the side wall of the capacitor part 14, resulting in the reduced property of the device produced. To remove the etching residue, a cleaning operation has been carried out. For example, JP-A-10-12836 discloses a method for removing the etching residue by using, as a cleaning solution, hydrochloric acid, nitric acid, hydrofluoric acid, a mixture thereof, water of 80° C. or higher temperature, or an organic solvent.

In production of a semiconductor memory device, when there is formed, as mentioned above, for example, a silicon oxide film as a protective mask 11 for formation of other element part, or a second inter-layer insulating film 15 so as to cover a capacitor part 14, platinum atoms or particles 13 are generated from the upper platinum thin film 10 of the capacitor part 14 and deposit on the protective mask 11 or the second inter-layer insulating film 15; when there is formed a contact hole communicating with the upper electrode, there adhere, onto the second inter-layer insulating film 15, the platinum atoms or particles vaporized from the upper platinum thin film, a reaction product thereof with chlorine gas (a dry-etching gas), i.e. platinum chloride, and an oxide thereof; further, they adhere even onto the back surface of a silicon substrate 1. Since the platinum atoms, in particular, easily cause thermal diffusion in the silicon substrate, the platinum atoms adhering onto the back surface of the substrate may move to the transistor element region of semiconductor device; this affects a serious problem on the property of the element. A similar problem arises also when, in forming an insulating film on other silicon substrate for production of a semiconductor device by using the apparatus used for formation of the above-mentioned protective mask or second inter-layer insulating film, the platinum atoms or particles remaining in the apparatus adhere onto the insulating film formed on the other silicon substrate or onto the back surface of the other silicon substrate. It is known that the above remaining of platinum contaminants, even if the amount is as small as about $1 \times 10^{10}$ atoms/cm$^2$, adversely affects the life time or electrical property of the semiconductor device produced.

Such contaminants include (1) a metal ion adsorbed by or bonded with the surface of a semiconductor substrate, the surface of an insulating film (e.g. a silicon oxide film) formed thereon, and the back surface of the substrate, and (2) metal particles adhering thereon.

It is necessary, therefore, to remove such contamination by platinum group metal. However, there has been developed almost no effective methods for removing the contamination.

In practical production of a semiconductor device, there is a case that one cleaning tank is used for a plurality of cleaning steps, depending upon the kind of the target substance to be removed. In such a case, if one cleaning tank used for cleaning of a substrate contaminated with a platinum group metal is used for cleaning of other substrate, secondary contamination may take place. Therefore, the contamination of the former substrate by platinum group metal need be removed beforehand. Use of one apparatus for a contaminated substrate and other substrate may be also conducted in various steps such as, oxide film formation step in addition to the above-mentioned cleaning step.

As the conventional chemical solutions for metal removal, there are known, for example, a mixed solution of hydrochloric acid, hydrogen peroxide and water ($HCl$—$H_2O_2$—$H_2O$: HPM); a mixed solution of sulfuric acid and hydrogen peroxide ($H_2SO_4$—$H_2O_2$: SPM); a mixed solution of nitric acid and hydrochloric acid (aqua regia); and a mixed solution of ammonia water, hydrogen peroxide and water ($NH_4OH$—$H_2O_2$—$H_2O$: APM). These conventional chemical solutions for metal removal, however, are used for ordinary heavy metals and are unable to sufficiently remove contaminants such as platinum and iridium having a very low ionization tendency, and are difficult to reduce the contamination level to less than $1 \times 10^{10}$ atoms/cm$^2$ mentioned above. Even if the contaminants are removed from the substrate surface, the removed contaminants are suspended in the cleaning solution used and, therefore, they readhere onto the substrate when the substrate is pulled up from the cleaning solution; after all, the contaminants are difficult to remove.

Techniques of removing a metal from the surface of silicon wafer or removing contaminants from the surface natural oxide of silicon wafer, by using a mixed solution of hydrochloric acid, hydrofluoric acid and aqueous hydrogen peroxide for cleaning of silicon wafer, are disclosed in, for example, JP-A-3-228327 and JP-A-8-31781. Any of these techniques is for removal of contaminants present on silicon wafer and is applied before various elements of device are formed. A technique of removing contaminants at normal temperature using a mixture of HF:HCl:$H_2O_2$:$H_2$=1:10:20:100 is disclosed in JP-A-3-228327; and a technique of removing contaminants using a solution obtained by diluting 17% HCl: 25% HF=1:1 100-fold with water and adding $H_2O_2$ thereto is disclosed in JP-A-8-31781. These techniques are effective for removal of ordinary metal contaminants but make no suggestion to contamination by platinum group metals such Pt and Ir.

In JP-A-7-45580 is disclosed a technique of removing metal contaminants such copper adhering onto the surface of wafer, by a series of cleaning steps which comprise first removing a natural oxide present on a silicon wafer with dilute hydrofluoric acid, then treating the resulting wafer with a mixture of hydrofluoric acid, hydrochloric acid, hydrogen peroxide and water, and thereafter cleaning with a mixture of hydrochloric acid, hydrogen peroxide and water.

The platinum group metals such as platinum and iridium are stable to hydrofluoric acid. Therefore, when treatment with hydrofluoric acid is conducted first, the contaminants adhering onto the oxide film surface, etc. are detached and transferred into the treating solution simultaneously with the etching of the oxide film but are present in the solution as a suspending component. Therefore, they readhere onto the substrate when it is taken out of the solution and cannot be removed sufficiently.

In JP-A-6-333898 is disclosed a technique of cleaning the surface of a semiconductor substrate using a cleaning solution containing (1) a strong acid and an oxidizing agent for removing the organic substances and inorganic substances remaining on the surface of the semiconductor substrate, (2) a fluorine-containing compound consisting of fluorine-generating fluorosulfuric acid or sulfuryl difluoride, for removing the residue and particles which remain on the surface of the semiconductor substrate when the surface is subjected to very slight etching, and (3) water. In the Examples of the literature is shown a case of removing the residue adhering after the dry etching of polysilicon film. However, no mention is made on the removal of platinum group metal.

In Japanese Patent Application No. 10-263482, the present inventor proposed, in order to remove the contamination by a platinum group metal, of an insulating film formed on a semiconductor substrate, a technique of removing the platinum group metal using a cleaning solution which is a mixture of (1) a chemical solution for metal removal and (2) a very small amount of hydrofluoric acid. According to the above technique, the hypochlorous acid ion or sulfuric acid ion formed in the cleaning system ionizes the platinum group metal and makes it soluble; thereby, the re-adhesion of the platinum group metal is prevented; thus, the contamination by platinum group metal can be reduced to less than $1 \times 10^{10}$ atoms/cm$^2$.

Since a fairly strongly acidic condition is required in order to achieve sufficient removal of contaminants, the above technique may produce an adverse effect depending upon the kind of the semiconductor device produced. Moreover, with the hypochlorous acid ion or sulfuric acid ion alone, although the contaminants on oxide film can be removed, re-adhesion of the removed contaminants cannot be sufficiently prevented.

SUMMARY OF THE INVENTION

The object of the present invention lies in providing (1) a cleaning solution which can reliably remove the contaminants derived from a platinum group metal (e.g. Pt or Ir), adhering onto the silicon-based insulating film (e.g. silicon oxide film) formed on a silicon substrate or onto the back surface of the silicon substrate and which further can prevent the re-adhesion of the removed contaminants; and (2) a cleaning method using said cleaning solution.

The present inventor made an intensive study in order to achieve the above object. As a result, it was found out that when a cleaning solution consisting of a chemical solution for metal removal and very small amounts of hydrofluoric acid and a chelating agent is sued in order to remove the contaminants derived from a platinum group metal, adhering onto (1) the insulating film formed on a semiconductor substrate and (2) the back surface of the substrate, the contaminants can be removed reliably and the removed contaminants react with the chelating agent and do not readhere. The above finding has led to the completion of the present invention.

The present invention lies in a process for producing, starting from a silicon substrate, a semiconductor device having a capacitor part comprising platinum group metal electrodes and a ferroelectric film, which process comprises a cleaning step of cleaning and removing the platinum group metal-derived contaminants adhering onto (1) the silicon-based insulating film formed in contact with the platinum group metal of the electrode(s) and (2) the back surface of the silicon substrate, by using a cleaning solution comprising a chemical solution for metal removal and very small amounts of hydrofluoric acid and a chelating agent.

According to the present invention, the contaminants derived from a platinum group metal can be removed reliably; the removed contaminants do not readhere, and secondary contamination in other device can be prevented. Further, in the present invention, since the back surface of a substrate is cleaned to remove the platinum group metal-derived contaminants after the formation or etching of a platinum group metal film, when the resulting substrate is transferred, by the use of a handler, to a next-step apparatus, for example, a CVD apparatus for silicon oxide film formation, the handler is not contaminated by the platinum group metal. As a result, it does not happen that other semiconductor substrate is cross-contaminated by the platinum group metal.

Formation of an inter-layer insulating film or the like on an exposed platinum group metal layer results in contamination of the surface of the formed inter-layer insulating film by the platinum group metal ion vaporized during the above formation. In the present invention, however, the thus-generated platinum group metal contaminants can be removed by dipping the substrate after the above formation in a cleaning solution to clean the principal and back surfaces of the substrate.

Moreover, in the present invention, since the cleaning solution contains a chelating agent, the concentration of hydrochloric acid in the cleaning solution can be made low; thereby, the adverse effect of cleaning on element part can be reduced.

By thus removing the platinum group metal-derived contaminants, there can be eliminated the diffusion of platinum group metal into semiconductor substrate and consequent deterioration of properties of elements such as transistor, whereby a highly reliable semiconductor device can be produced.

DETAILED DESCRIPTION OF THE PREFERRED EMBODIMENTS

Figure 1:
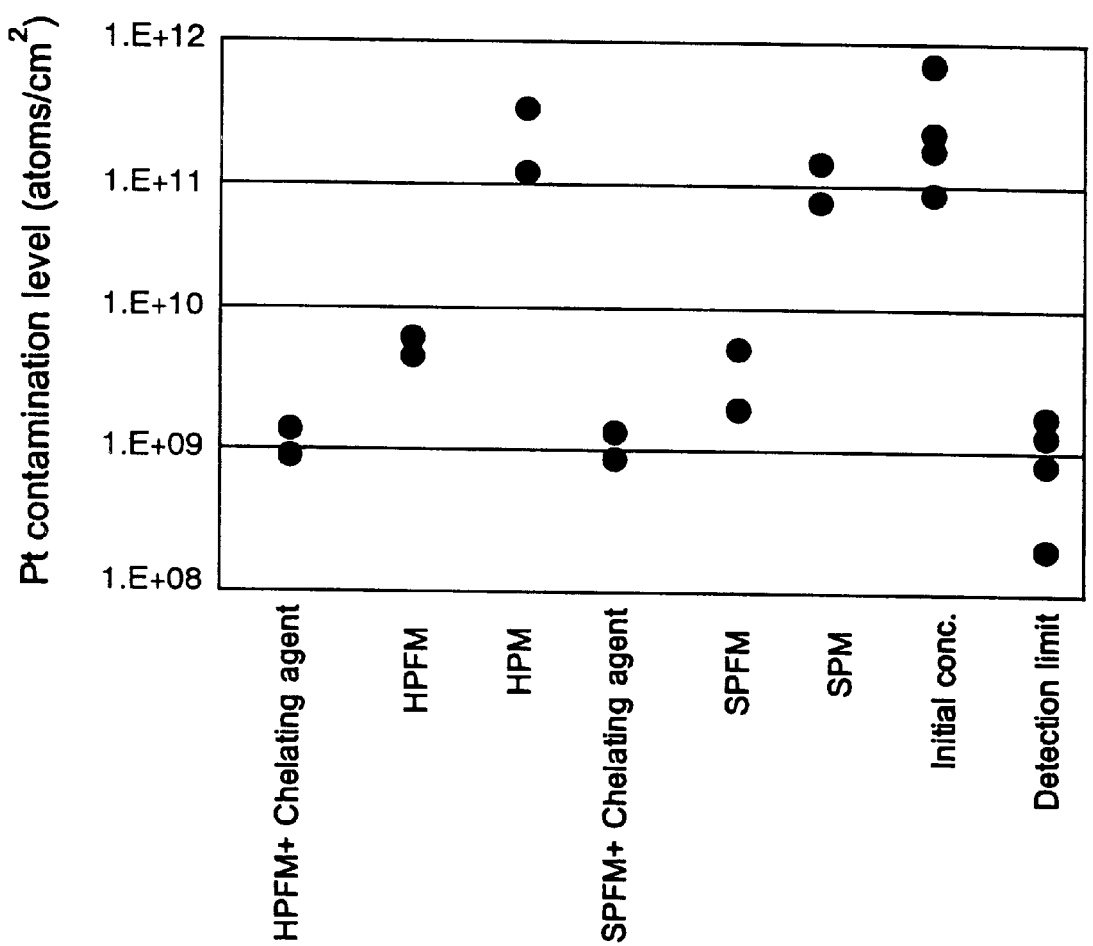
FIG. 1 is a graph showing the levels of remaining Pt contamination when cleaning solutions of the present invention or conventional techniques were used.

The present invention is hereinafter described in detail.

As the chemical solution for metal removal, used in the present invention, there can be mentioned a solution comprising an inorganic acid (e.g. hydrochloric acid or sulfuric acid) and hydrogen peroxide. As the inorganic acid, hydrochloric acid is preferred.

According to the investigation by the present inventor, it was found out that a platinum group metal can be removed at a high efficiency when there is used a cleaning solution containing (1) components (e.g. a combination of hydrochloric acid and hydrogen peroxide) capable of generating hypochlorous acid in a cleaning system and (2) a small amount, preferably 1 wt % or less of hydrofluoric acid. An aqueous hypochlorous acid solution is very unstable and is ordinarily available in the form of a hypochlorite (e.g. sodium or potassium salt). The hypochlorite, however, is unusable because it contains a cation (e.g. Na ion or K ion) which adversely affects the elements of semiconductor device. In the present invention, use of unstable hypochlorous acid has been made possible by using, in combination, the components capable of generating hypochlorous acid in the cleaning system.

Hydrochloric acid and hydrogen peroxide react with each other to generate hypochlorous acid. This hypochlorous acid reacts with a platinum group metal (e.g. Pt or Ir) as contaminant to convert the metal, directly or via its chloride (e.g. platinum chloride or iridium chloride), into tetrachloroplatinic acid ion ($H[PtCl_4]^-$) or tetrachloroiridic acid ion ($H[IrCl_4]^-$), thereby, the amount of contaminant (platinum group metal) remaining as a suspending component in the cleaning solution becomes small. Since the cleaning solution of the present invention further contains a chelating agent, the platinum group metal remaining in the cleaning solution is reacted with the chelating agent and converted into a chelate; as a result, substantially no suspending component remains in the cleaning solution and re-adhesion of contaminant can be prevented reliably.

At this time, the hydrofluoric acid also contained in the cleaning solution etches a silicon-based insulating film, whereby the platinum group metal-derived contaminants adhering onto the silicon-based insulating film can be removed easily.

The chelating agent used in the present invention can be any chelating agent capable of forming a chelate with a platinum group metal. However, it is preferably a dibasic carboxylic acid because the acid is stable to the chemical solution for metal removal used together.

As the dibasic carboxylic acid, there can be mentioned aliphatic dibasic carboxylic acids such as oxalic acid, malonic acid, succinic acid, citric acid, malic acid, fumaric acid, citraconic acid and tartaric acid; and aromatic dibasic carboxylic acids such as phthalic acid and naphthal acid. Besides these carboxylic acids, there can also be used polybasic carboxylic acids such as pyromellitic acid.

The amount of the chelating agent used is about 100 ppm to 1% by weight, and a sufficient effect can be obtained with this amount.

FIG. 1 is a graph showing the levels of remaining Pt contamination when the Pt contaminants adhering onto (1) a silicon oxide film formed in a thickness of about 200 nm by CVD and (2) the back surface of a silicon substrate were removed using the cleaning solutions of the present invention or conventional techniques. Shown in FIG. 1 are the Pt atoms adhering per unit area, measured for 2 to 4 wafers. As appreciated from FIG. 1, when a substrate having an initial Pt contamination level of about $1 \times 10^{11-12}$ atoms/cm$^2$ is treated with conventional HPM ($HCl:H_2O_2:H_2O=1:1:5$) or conventional SPM ($H_2SO_4:H_2O_2=4:1$), substantially no contaminant removal takes place. In contrast, when the treatment is made with HPFM (HCl:$H_2O_2$:$H_2O$=3:1:5+0.1 wt. % HF) or SPFM ($H_2SO_4$:$H_2O_2$=4:1+0.1 wt. % HF), previously proposed by the present inventor, the contamination level is reduced to less than $1\times10^{10}$ atoms/cm$^2$ and a sufficient effect is obtained. When a chelating agent is added to HPFM or SPFM, the Pt contamination can be removed to nearly the detection limit. Incidentally, the treatment was conducted at 65° C. (the temperature of cleaning solution) when the cleaning solution was a hydrochloric acid type, and at 130° C. when the cleaning solution was a sulfuric acid type. The measurement of the Pt contamination level was made by wafer surface treatment using hot aqua regia recovering solution and subsequent ICP-MS measurement; in this case, the detection limit is about $1\times10^9$ atoms/cm$^2$.

Hydrochloric acid can be used in a concentration of 1 to 25% by weight. In the present invention, a concentration of 1 to 10% by weight is preferred in view of the adverse effect on other element part.

Hydrogen peroxide is preferably used in a concentration of about 0.5 to 5% by weight. When the concentration of hydrochloric acid is low, the concentration of hydrogen peroxide is preferred to be correspondingly low.

The amount of hydrofluoric acid used can be determined so as to become optimum relative to the etching rate of silicon oxide film, but is preferably 1% by weight or less. The amount can be larger than that when there is etched a silicon-based insulating film other than silicon oxide film, such as silicon nitride film or silicon oxide nitride film. Preferably, the amount of hydrofluoric acid is determined so that the etching rate becomes 1 to 5 nm/min.

The cleaning solution of the present invention, similarly to conventional cleaning solutions containing hydrogen peroxide, has no sufficiently long life. Therefore, it is desired that hydrogen peroxide be mixed with other components of the present cleaning solution right before the use of the cleaning solution.

When hydrochloric acid is used in the cleaning solution, the cleaning solution is used in cleaning operation at a temperature of room temperature (25° C.) solution, preferably at a temperature of about 50 to 70° C. The cleaning time can be appropriately varied depending upon the amounts of hydrochloric acid and hydrogen peroxide, the use temperature of cleaning solution, etc. When the cleaning time is too long, there may be a case that the thinning of oxide film by hydrofluoric acid exceeds an allowable limit. When the cleaning time is too short, sufficient effect may not be obtainable. The cleaning time is ordinarily about 1 to 15 minutes, preferably about 5 to 10 minutes.

In the present invention, the contaminants on the back surface of a substrate can be easily removed by, prior to formation of a platinum group metal layer, forming a thin oxide film layer on the back surface of the substrate. Since platinum group metal-derived contaminants are adsorbed more easily by silicon than by silicon oxide film, the above formation of a thin oxide film layer on the back surface of the substrate is effective. The thin oxide film layer can be formed by a known method such as thermal oxidation or chemical vapor deposition (CVD), and the thickness of the film can be about 10 to 100 nm.

In the present invention, the cleaning operation can be conducted by dipping a whole operation can be conducted by dipping a whole substrate including elements in a cleaning solution; or, after formation of an element part on a substrate, by contacting only the back surface of the substrate with a cleaning solution. The cleaning operation may also be conducted by other known method such as spraying or cleaning with running water.

The present invention is described specifically below by referring to Examples. However, the present invention is in no way restricted to these Examples.

FIG. 2(a) to FIG. 2(g) are sectional views showing steps employed in production of a semiconductor memory device which has, in combination, a MOS transistor and a capacitor part comprising platinum group metal electrodes and a ferroelectric film and which can conduct data storage by charge accumulation.

Figure 2A:
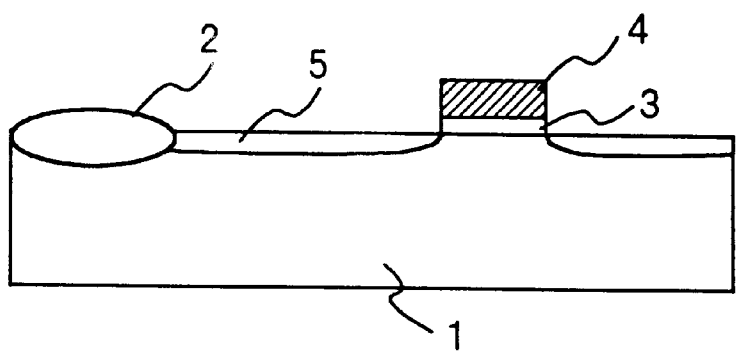
FIG. 2(a) to FIG. 2(g) are sectional views of steps showing an embodiment of the process for production of a semiconductor device according to the present invention.

First, a MOS type transistor is formed on a silicon substrate 1 according to a known method, as shown in FIG. 2(a). That is, there is formed a field oxide 2 as an element-isolating region, by a known method such as LOCOS; subsequently, there is formed a silicon oxide film as a gate-insulating film 3 in a thickness of about 50 to 100 nm, by thermal oxidation. Then, a P-doped polysilicon film and a WSi film are formed in this order; after which they are subjected to patterning to form a gate electrode 4. Thereafter, ion implantation is conducted to form an impurity-diffused layer 5, whereby a MOSFET is completed.

Figure 2B:
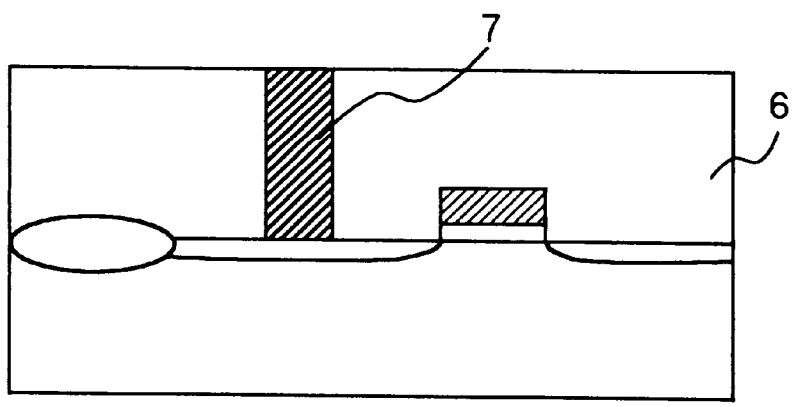

Next, as shown in FIG. 2(b), there is formed, by CVD, a BPSG film as a first inter-layer insulating film 6; then, etching is conducted to form a contact hole; in the hole are formed a Ti film and a W film in this order to form a vertical interconnect 7.

Figure 2C:
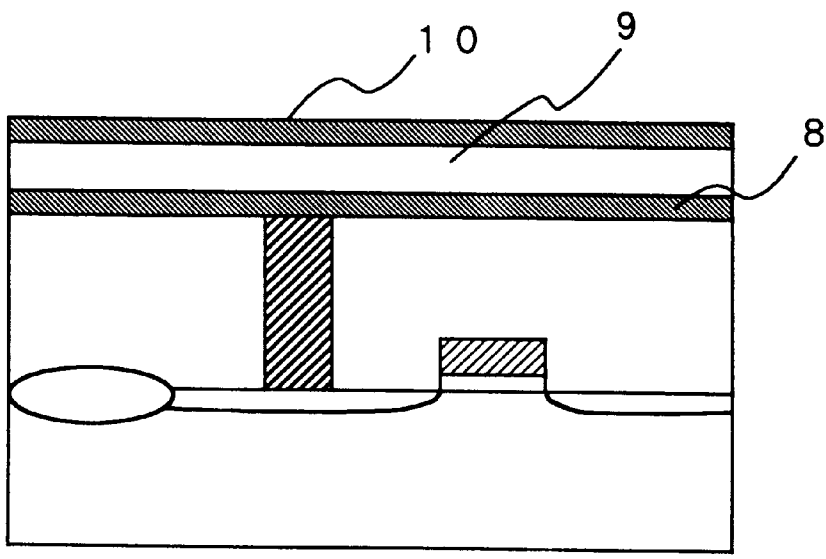

Subsequently, as shown in FIG. 2(c), there is formed a platinum thin film which becomes a lower electrode layer 8 of capacitor part; then, there are formed, by sputtering, a ferroelectric film 9 (e.g. PZT) and a platinum or iridium thin film which becomes an upper electrode layer 10 of capacitor part, in this order. At this time, platinum-derived contaminants adhere on the back surface of substrate. Since the principal surface of wafer has a platinum film thereon, no wafer cleaning by dipping is conducted and only the back surface of substrate is cleaned.

Figure 2D:
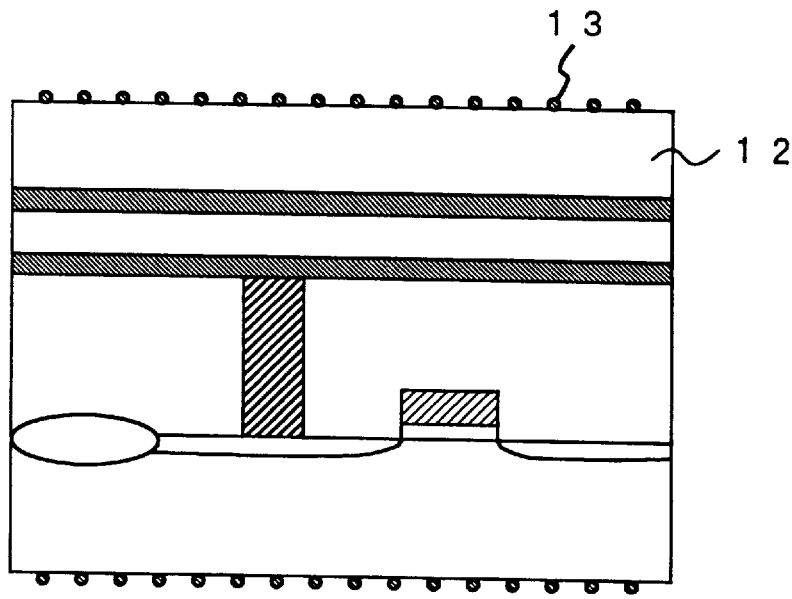
Figure 2E:
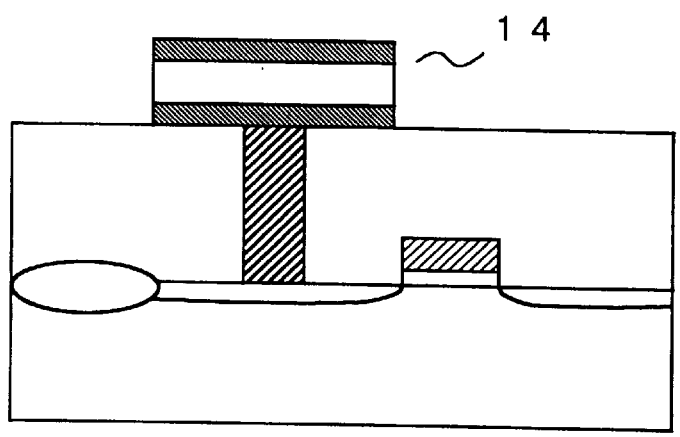

Next, as shown in FIG. 2(d), a masking layer 11 consisting of a silicon oxide film is formed by CVD in order to protect the above-formed capacitor part at a time when other element part is formed. At this time, platinum-derived contaminants 13 adhere onto the masking layer 11 and the back surface of the substrate 1. The contaminants 13 are presumed to be adhered by release of platinum ion from thin platinum film present on wafer, during formation of silicon oxide film by CVD, or by scattering of contaminants adhering onto the back surface of wafer when there is no cleaning of the back surface in the previous step. This fact that platinum-derived contaminants adhere onto the surface of silicon oxide film in a step other than formation of platinum thin film or etching of platinum thin film, was newly found out by the present inventor. If a next step is conducted without removing platinum-derived contaminants formed in this step, the contaminants diffuse in the wafer or are transferred onto other wafer, whereby the properties of elements are affected adversely.

Hence, the substrate contaminated with platinum is dipped in the cleaning solution of the present invention and subjected to a cleaning operation. The composition of cleaning solution and conditions of cleaning used in the cleaning operation are as follows.

| Composition of cleaning solution | |
| --- | --- |
| Hydrochloric acid | 5% by weight |
| Hydrogen peroxide | 4% by weight |
| Hydrofluoric acid | 0.1% by weight |
| Chelating agent (oxalic acid) | 1000 ppm |
| Water | Remainder |
| Cleaning conditions | |
| Solution temperature | 65° C. |
| Dipping time | 10 minutes |

By conducting a cleaning operation under the above conditions, contaminants can be removed reliably.

Next, other element not shown is formed. Then, a photoresist pattern is formed on the masking layer 11; using this resist pattern as a mask, dry etching is conducted for the masking layer 11, the capacitor upper electrode layer 10, the ferroelectric film 9 and the capacitor lower electrode layer 8 to form a desired capacitor part 14, and the masking layer remaining on the capacitor part 14 is removed [see FIG. 2(e)]. At this time, an etching residue may adhere, but it can be removed by a known method or using the cleaning solution of the present invention.

Figure 2F:
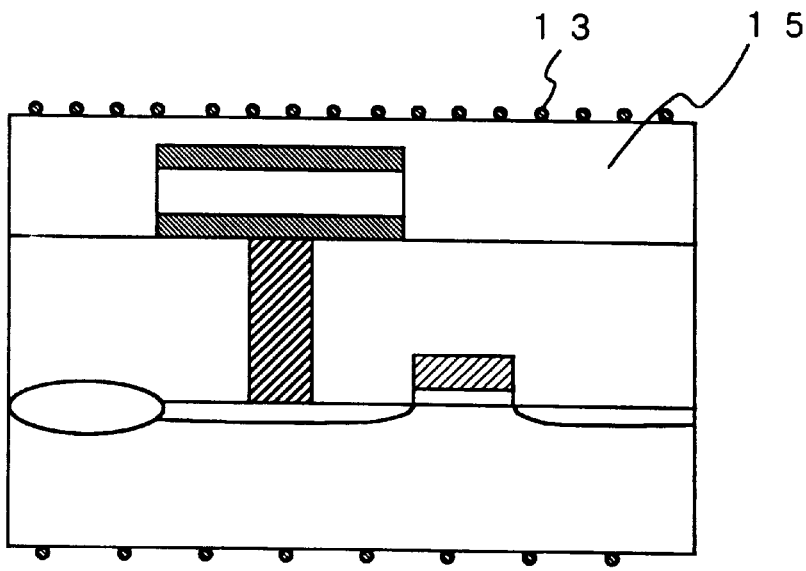

Next, as shown in FIG. 2(f), a second inter-layer insulating film 15 is formed so as to cover the capacitor part 14 and the first inter-layer insulating film 6. At this time as well, a metal ion is released from the platinum group metal layer of capacitor part and contaminants adhere onto the second inter-layer insulating film and the back surface of substrate. These contaminants can be removed by conducting the same cleaning operation as mentioned above.

Figure 2G:
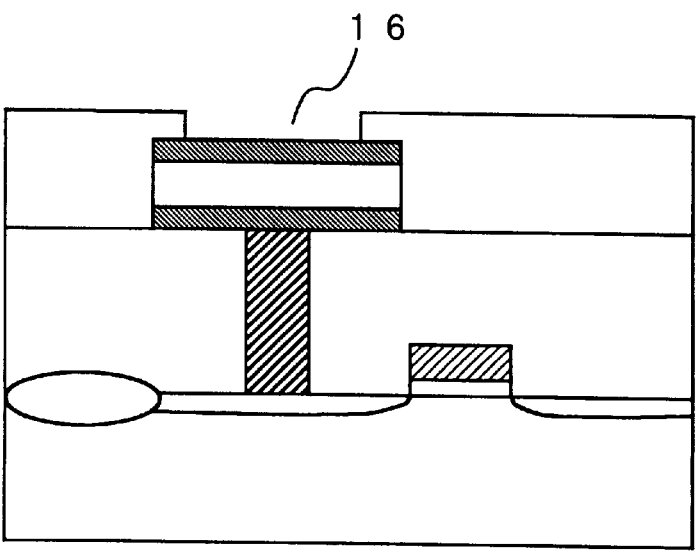

Successively, in the second inter-layer insulating film 15 is formed an opening 16 for connecting an upper wiring (to be formed later) to the capacitor upper electrode layer 10, as shown in FIG. 2(g). At this time, the exposed upper electrode layer 10 may be etched slightly and there may appear contamination. In this case, since the upper electrode is exposed, only the back surface of substrate is cleaned by spraying, cleaning with running water, or the like. Alternatively, there may be conducted a step of dipping the substrate in a cleaning solution not corrosive to the upper electrode, to remove the etching residue.

Figure 3:
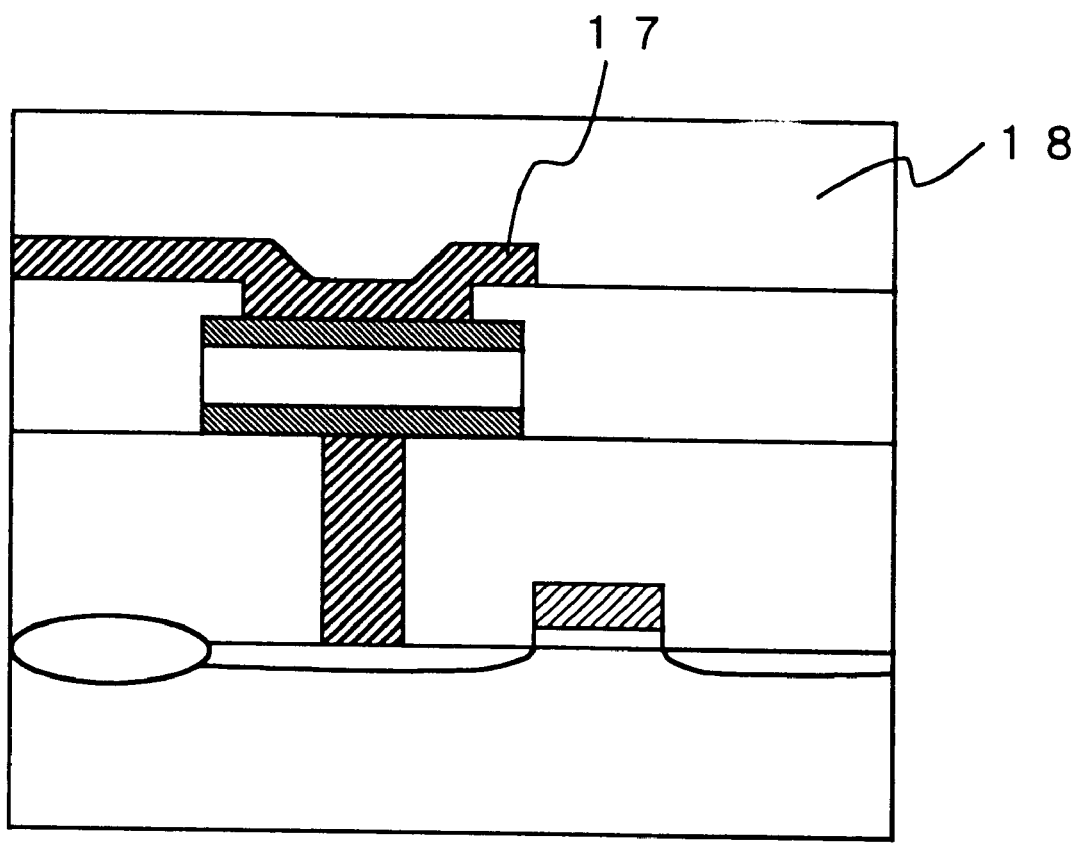
FIG. 3 is a schematic sectional view showing an example of a semiconductor memory device produced by the present invention or a conventional process, which device has, in combination, a MOS transistor and a capacitor part comprising platinum group metal electrodes and a ferroelectric film and which can conduct data storage by charge accumulation.
Figure 4A:
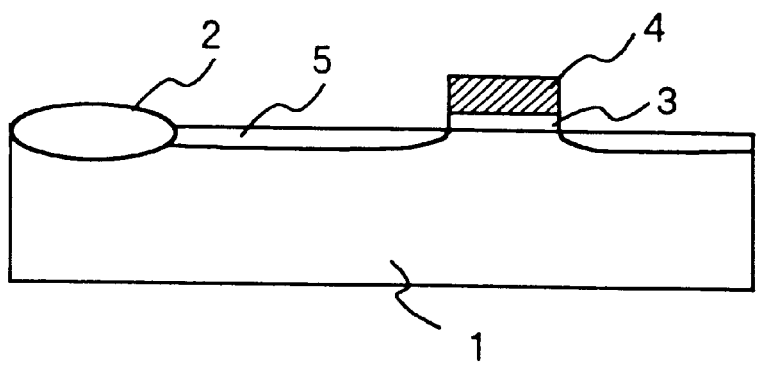
FIG. 4(a) to FIG. 4(i) are sectional views of steps showing an example of a conventional process for production of a semiconductor device.
Figure 4B:
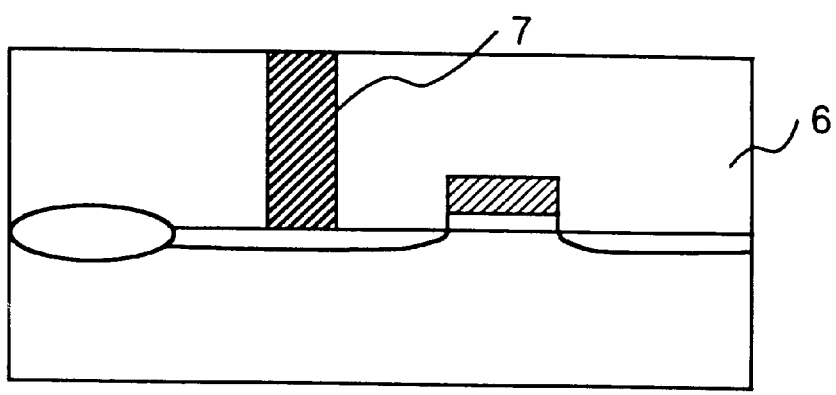
Figure 4C:
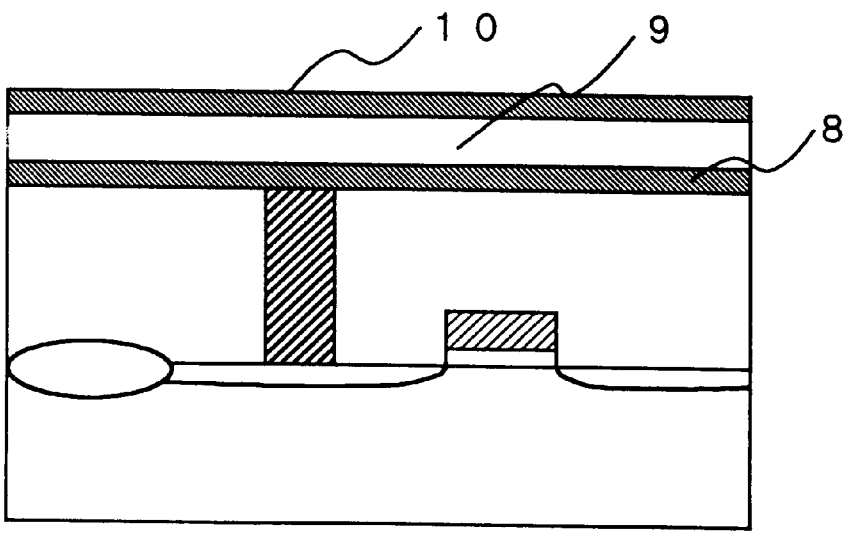
Figure 4D:
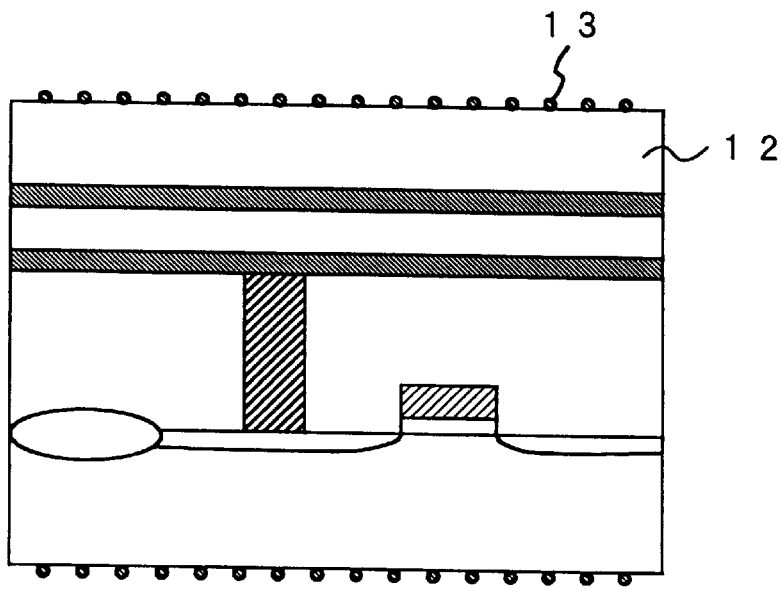
Figure 4E:
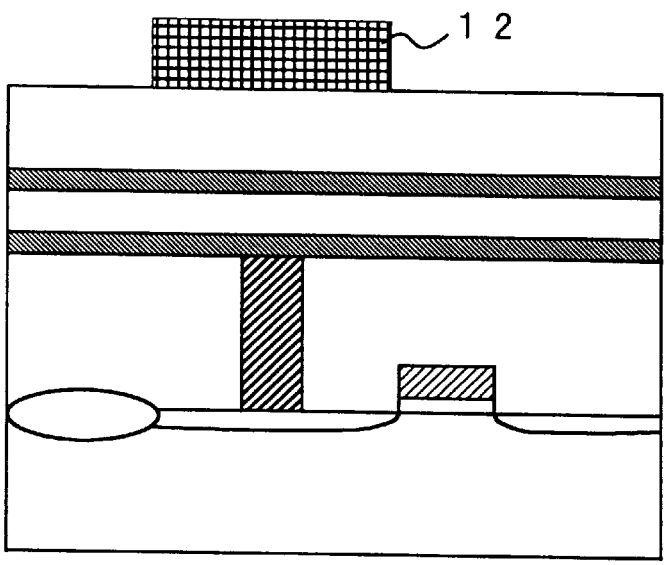
Figure 4F:
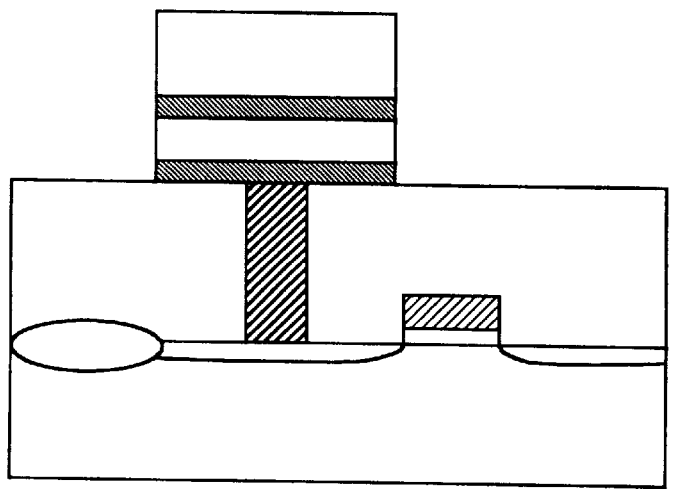
Figure 4G:
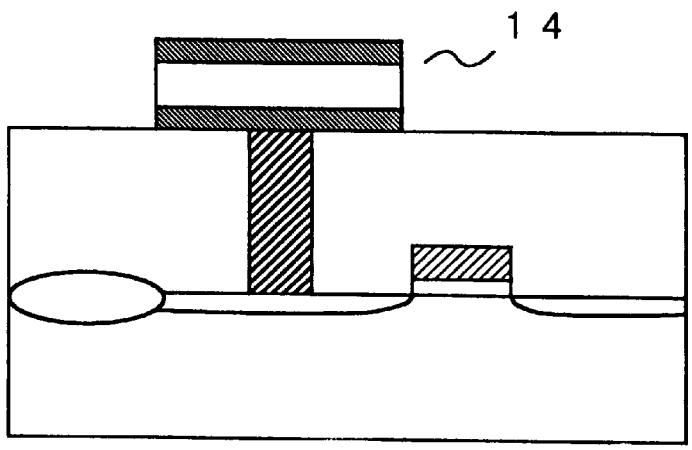
Figure 4H:
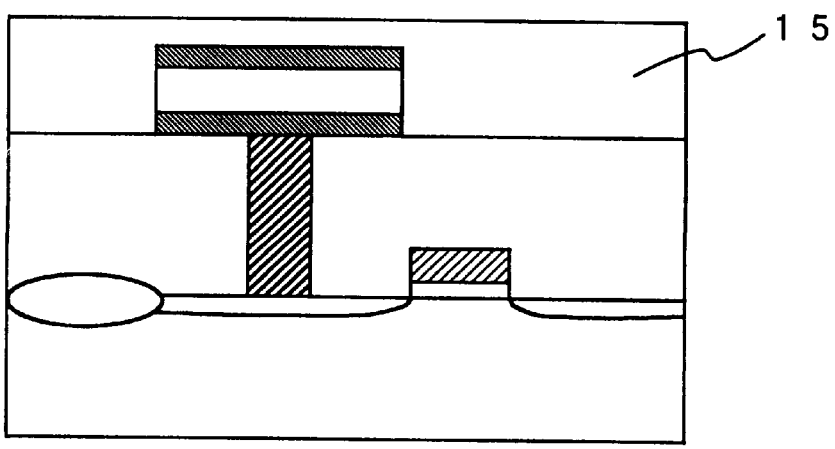
Figure 4I:
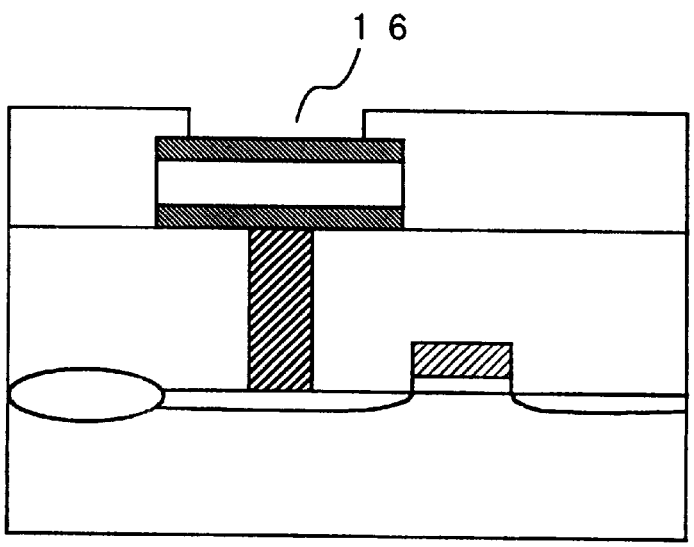

Lastly, a metal film is formed so as to fill the opening 16 and further cover the whole surface of the material obtained in the step of FIG. 2(g); the metal film is subjected to patterning in a desired shape to form an upper wiring 17; thereon is formed a third inter-layer insulating film 18 (e.g. a silicon nitride film), whereby is formed a semiconductor memory device having a ferroelectric capacitor containing platinum electrodes, such as shown in the sectional view of FIG. 3. After the formation of an upper wiring 17, the back surface of substrate is cleaned and a third inter-layer insulting film 18 is formed, after which the wafer is cleaned by dipping.

What is claimed is:

1. A process for producing a semiconductor device comprising:

forming a capacitor part comprising a platinum group metal on a silicon substrate: and applying a cleaning solution comprising a chemical solution for metal removal, very small amounts of hydrofluoric acid and a chelating agent to remove a platinum group metal contaminant from said semiconductor device including a back surface of said silicon substrate.

2. The process for producing a semiconductor device according to claim 1, further comprising:

before said applying of a cleaning solution, forming said capacitor part comprising a platinum group metal lower electrode layer, a ferroelectric film and a platinum group metal upper layer and forming a silicon-based insulating film which acts as a masking layer for said capacitor part when an element part other than said capacitor part is formed.

3. The process for producing a semiconductor device according to claim 1, further comprising:

before said applying of a cleaning solution, forming a silicon-based interlayer insulating film covering said capacitor part.

4. The process for producing a semiconductor device according to claim 3, further comprising:

before said applying of a cleaning solution, forming, in said silicon-based interlayer insulating film, a contact hole for formation of a wiring electrode connecting to said capacitor part.

5. The process for producing a semiconductor device according to claim 1, wherein said chemical solution for metal removal comprises hydrochloric acid and hydrogen peroxide.

6. The process for producing a semiconductor device according to claim 5, wherein a concentration of hydrochloric acid in said cleaning solution for metal removal is 1 to 10% by weight.

7. The process for producing a semiconductor device according to claim 1, wherein said chemical solution for metal removal comprises sulfuric acid and hydrogen peroxide.

8. The process for producing a semiconductor device according to claim 1, wherein said cleaning solution is used at a temperature ranging from room temperature to a temperature lower than a boiling point of said cleaning solution.

9. The process for producing a semiconductor device according to claim 1, wherein said chelating agent comprises a dibasic carboxylic acid.

10. The process for producing a semiconductor device according to claim 1, further comprising:

before forming a capacitor part, forming a thin oxide film layer on a back surface of said silicon substrate to prevent contamination by said platinum group metal.

11. The process for producing a semiconductor device according to claim 1, wherein said cleaning solution is applied only to said back surface of said silicon substrate.

12. The process for producing a semiconductor device according to claim 1, wherein said platinum group metal contaminant is removed from a back surface of said silicon substrate.

13. The process for producing a semiconductor device according to claim 1, wherein contamination by said platinum group metal is reduced to less than $1 \times 10^{10}$ atoms/cm$^2$.

14. The process for producing a semiconductor device according to claim 1, wherein said very small amounts of hydrofluoric acid comprises less than or equal to 1 weight percent of hydrofluoric acid.

15. The process for producing a semiconductor device according to claim 1, wherein said chelating agent bonds with ions of said platinum group metal to prevent said ions from readhering to said semiconductor device.

16. The process for producing a semiconductor device according to claim 1, wherein said cleaning solution comprises about 100 ppm to 1 weight percent chelating agent.

17. The process for producing a semiconductor device according to claim 1, wherein said cleaning solution comprises 0.5 to 5 weight percent hydrogen peroxide.

18. The process for producing a semiconductor device according to claim 1, wherein said cleaning solution comprises less than or equal to 1 weight percent hydrofluoric acid.

19. The process for producing a semiconductor device according to claim 1, wherein said cleaning solution is applied for 1 to 15 minutes.

20. The process for producing a semiconductor device according to claim 1, wherein said applying said cleaning solution comprises spraying said cleaning solution on said semiconductor device.

21. The process for producing a semiconductor device according to claim 1, wherein said chelating agent comprises oxalic acid.

22. A process for cleaning a semiconductor device comprising:
    applying a cleaning solution comprising a chemical solution for metal removal, very small amounts of hydrofluoric acid and a chelating agent to remove platinum group metal contaminants from said semiconductor device including a back surface of said silicon substrate.

* * * * *